(12) United States Patent
Inoue

(10) Patent No.: US 7,062,239 B2
(45) Date of Patent: Jun. 13, 2006

(54) ON-VEHICLE EQUIPMENT FOR DEDICATED SHORT-RANGE COMMUNICATION IN INTELLIGENT TRANSPORT SYSTEM

(75) Inventor: Masahiro Inoue, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 690 days.

(21) Appl. No.: 10/114,114

(22) Filed: Apr. 3, 2002

(65) Prior Publication Data

US 2003/0129952 A1 Jul. 10, 2003

(30) Foreign Application Priority Data

Jan. 9, 2002 (JP) ..................... 2002-002519

(51) Int. Cl.
*H04B 1/18* (2006.01)

(52) U.S. Cl. ............... 455/166.2; 455/41.2; 455/42; 455/99; 340/928; 340/933

(58) Field of Classification Search ........... 455/166.2, 455/166.1, 130, 139, 141, 41.2, 41.1, 42, 455/39, 99, 107, 464; 340/928, 933, 907, 340/943, 917; 235/375, 384, 382; 701/200, 701/207, 205
See application file for complete search history.

(56) References Cited

U.S. PATENT DOCUMENTS

| | | | | |
|---|---|---|---|---|
| 5,424,727 A * | 6/1995 | Shieh | ................... | 340/928 |
| 5,640,156 A * | 6/1997 | Okuda et al. | ............... | 340/928 |
| 5,962,833 A * | 10/1999 | Hayashi | ................... | 235/384 |
| 6,019,285 A * | 2/2000 | Isobe et al. | ............... | 235/384 |
| 6,252,524 B1 * | 6/2001 | Takikita | ................... | 340/933 |
| 6,300,882 B1 * | 10/2001 | Inoue | ................... | 340/933 |
| 6,337,622 B1 * | 1/2002 | Sugano | ................... | 340/438 |
| 6,356,207 B1 * | 3/2002 | Oouchi | ................... | 340/928 |
| 6,390,365 B1 * | 5/2002 | Karasawa | ............... | 235/384 |
| 6,396,418 B1 * | 5/2002 | Naito | ................... | 340/928 |
| 6,590,506 B1 * | 7/2003 | Oouchi | ................... | 340/933 |
| 6,636,799 B1 * | 10/2003 | D'Amico et al. | ........... | 701/200 |
| 6,744,377 B1 * | 6/2004 | Inoue | ................... | 340/928 |

FOREIGN PATENT DOCUMENTS

| | | | |
|---|---|---|---|
| JP | 05-313579 A | | 11/1993 |
| JP | 09-093169 A | | 4/1997 |
| JP | 2947797 | | 7/1999 |
| JP | 2000-115004 A | | 4/2000 |

* cited by examiner

*Primary Examiner*—Sonny Trinh
(74) *Attorney, Agent, or Firm*—Sughrue Mion, PLLC

(57) ABSTRACT

In an on-vehicle equipment for Dedicated Short-Range Communication (DSRC) in Intelligent Transport System (ITS), a priority sequence for switching local frequencies of f1 to f7 in correspondence with types of on-road equipment is previously set, the local frequencies are sequentially outputted at a predetermined cycle in accordance with the priority sequence, a received frequency signal is compared with a selected frequency signal, and when the received frequency signal is the same as the selection frequency signal, the local frequency corresponding to these is determined as a desirable communication frequency, and the communication frequency is fixed as being this local frequency with high efficiency.

5 Claims, 9 Drawing Sheets

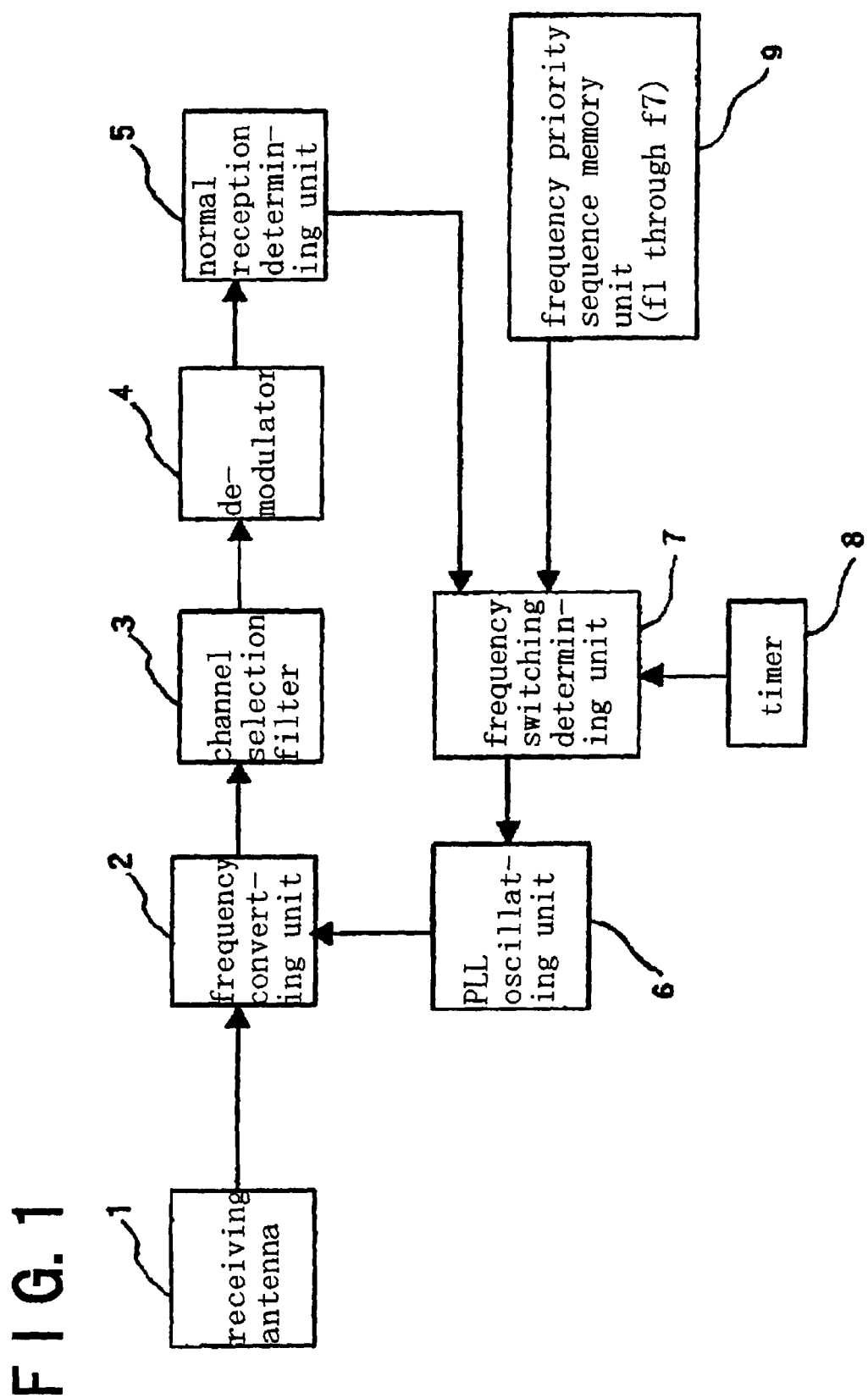
F I G. 1

FIG. 2

| frequency | priority sequence | example of use |
|---|---|---|
| f 1 | 1 | ETC |
| f 2 | 1 | |
| f 3 | 2 | AHS-i information shower |
| f 4 | 2 | |
| f 5 | 3 | logistic control |
| f 6 | 3 | |
| f 7 | 4 | drive-through shop gas station |

FIG. 3

| step | 1st priority | 2nd priority | 3rd priority | 4th priority |
|---|---|---|---|---|
| 1 | f 1 ⇒ f 2 ⇒ | f 3 ⇒ | | |
| 2 | f 1 ⇒ f 2 ⇒ | f 4 ⇒ | | |
| 3 | f 1 ⇒ f 2 ⇒ | ⇒ | f 5 | |
| 4 | f 1 ⇒ f 2 ⇒ | f 3 ⇒ | | |
| 5 | f 1 ⇒ f 2 ⇒ | f 4 ⇒ | | |
| 6 | f 1 ⇒ f 2 ⇒ | ⇒ | f 6 | |
| 7 | f 1 ⇒ f 2 ⇒ | f 3 ⇒ | | |
| 8 | f 1 ⇒ f 2 ⇒ | f 4 ⇒ | | |
| 9 | f 1 ⇒ f 2 ⇒ | ⇒ | f 5 | |
| 10 | f 1 ⇒ f 2 ⇒ | f 3 ⇒ | | |
| 11 | f 1 ⇒ f 2 ⇒ | f 4 ⇒ | | |
| 12 | f 1 ⇒ f 2 ⇒ | ⇒ | f 6 | |
| 13 | f 1 ⇒ f 2 ⇒ | f 3 ⇒ | | |
| 14 | f 1 ⇒ f 2 ⇒ | f 4 ⇒ | | |
| 15 | f 1 ⇒ f 2 ⇒ | ⇒ | ⇒ | f 7 |

FIG. 4

| step | 1st priority | 2nd priority | 3rd priority |
|---|---|---|---|
| 1 | f1⇒f2⇒ | f3⇒ | |
| 2 | f1⇒f2⇒ | f4⇒ | |
| 3 | f1⇒f2⇒ | ⇒ | f5 |
| 4 | f1⇒f2⇒ | f3⇒ | |
| 5 | f1⇒f2⇒ | f4⇒ | |
| 6 | f1⇒f2⇒ | ⇒ | f6 |
| 7 | f1⇒f2⇒ | f3⇒ | |
| 8 | f1⇒f2⇒ | f4⇒ | |
| 9 | f1⇒f2⇒ | ⇒ | f5 |
| 10 | f1⇒f2⇒ | f3⇒ | |
| 11 | f1⇒f2⇒ | f4⇒ | |
| 12 | f1⇒f2⇒ | ⇒ | f6⇒f7 |

| Vehicle speed (km/h) | Allowing frequency search | | | |
|---|---|---|---|---|
| | 1st priority | 2nd priority | 3rd priority | Others |
| 5 or less | ○ | ○ | ○ | ○ |
| 5 through 30 | ○ | ○ | ○ | × |
| 30 through 60 | ○ | ○ | × | × |
| 60 or more | ○ | × | × | × |

ON-VEHICLE EQUIPMENT FOR DEDICATED SHORT-RANGE COMMUNICATION IN INTELLIGENT TRANSPORT SYSTEM

BACKGROUND OF THE INVENTION

1. Field of the Invention

The present invention relates to an on-vehicle equipment provided on a side of a vehicle in dedicated short-range communication in intelligent transport system, in particular, an on-vehicle equipment which can firmly fix a desirable receive channel with high efficiency.

2. Description of Background Art

Intelligent transport system (hereinbelow referred to as ITS) is to transmit and receive various data by communication between an on-road equipment provided on a side of road and an on-vehicle equipment provided on a side of vehicle in use of dedicated short-range communication (hereinbelow referred to as DSRC) for communicating only within a limited range on a road utilizing a radio wave in the microwave band.

In ITS, an electronic toll collection system (hereinbelow referred to as ETC) is included. It is a system for automatically collecting toll without stopping vehicles. The system enables an automatic toll payment procedure in use of the above-mentioned DSRC without temporarily stopping a vehicle when the vehicle passes through a tollgate in an expressway. In ETC, an on-vehicle equipment on the vehicle side communicates with on-road equipments, respectively provided in tollgates. Two frequencies F1 and F2 are alternately allocated to adjacent gates to avoid interference between the frequencies. These two frequencies F1 and F2 and a communication method are determined by the standard of DSRC.

According to DSRC, for example, a vehicle approaching a toll gate alternately switching over between the frequencies F1 and F2 as a local frequency because it is unknown whether the frequency of the toll gate is F1 or F2. The vehicle receives data, and selects the frequency by fixing the frequency when the data are normally received.

FIG. 9 is a block chart in a conventional on-vehicle equipment for DSRC used in ITS disclosed in, for example, JP-B-2947797. In FIG. 9, numerical reference 1 designates a receiving antenna for receiving radio wave sent out of the on-road equipment; numerical reference 2 designates a frequency converting unit for converting a frequency of the radio wave received by the receiving antenna 1 to a predetermined receiving frequency; numerical reference 3 designates a channel selecting filter for taking out only a predetermined channel from the signal of which frequency is converted by the frequency converter 2; numerical reference 4 designates a demodulator for digitizing an output from the channel selecting filter 3; numerical reference 5 designates a normal reception determining unit for judging whether or not the received data are normal using error check such as cyclic redundancy check (CRC); numerical reference 6 designates a phase locked loop (PLL) oscillating unit for producing a local frequency for the frequency converting unit 2; numerical reference 7 designates a frequency switching determining unit for determining the frequency from the received data and judging whether or not the local frequency outputted from the PLL oscillating unit 6 is fixed or switched over based on the received F1/F2 signal as the frequency signal of the judged frequency and selected F1/F2 signal as a selecting frequency signal representing a currently selected frequency; numerical reference 8 designates a timer for controlling a cycle of the selected frequency signal; and numerical reference 9 designates a frequency memory unit, in which the frequencies F1 and F2 sent out of the on-road equipments are memorized.

Next, an operation will be described. FIG. 10 is a flow chart showing an operation of the frequency switching determining unit in the conventional on-vehicle equipment for DSRC in the ITS. In Step S41 of FIG. 10, it is judged whether or not the timer 8 for controlling the output cycle of the selected F1/F2 signal is effective. If the timer is not effective, in Step S42, when the currently selected frequency is F1, it is switched to F2, and when the currently selected frequency is F2, it is switched to F1, and the selected F1/F2 signal is outputted. In Step S43, the timer 8 is set.

If the timer 8 is judged to be effective in Step S41, it is judged whether or not a radio wave sent out of the on-road equipment is normally received in Step S44. If the radio wave is normally received, in Step S45, the received frequency is determined. In Step S46, the received F1/F2 signal is outputted. In Step S47, the received F1/F2 signal is compared with the selected F1/F2 signal selected in Step S42. In Step S48, when the received F1/F2 signal is the same as the selected F1/F2 signal, a local frequency outputted from the PLL oscillating unit 6 is fixed. In Step S49, if the received F1/F2 signal is different from the selected F1/F2 signal, the local frequency outputted from the PLL oscillating unit 6 is switched over.

In the conventional DSRC of ITS, only ETC is available, whereby the two frequencies of the above-described two channels of F1 and F2 are used. However, in recent years, various applications to, for example, collection of charges in gas stations and drive-through shops and traffic information service are planned besides ETC. Accordingly, seven frequencies (seven channels) are allowed to use in accordance with the DSRC standard.

In the conventional on-vehicle equipment for DSRC, there is no measure to distinguish a frequency used in a communication area and it is impossible to select the frequency until a vehicle approaches to the communication area as described above. Therefore, the two frequencies are switched over by a predetermined time in order to select one. However, when the system is applied to an on-vehicle equipment for DSRC using all applications other than ETC, it is necessary to select the seven frequencies by an equal time period, whereby there is a problem that a substantially long time is required to select the frequencies.

FIG. 11 illustrates a procedure of the conventional on-vehicle equipment for DSRC, wherein the problems will be explained in reference of the figure. An entrance of a toll lane or the like ordinarily has two antennas, arranged in serial with respect to a traveling direction of vehicle, by each lane for the purpose of preventing erroneous detection of types of motor vehicle, and an identical frequency, e.g. F1, is sent. In FIG. 11, rectangles of solid line represent an outgoing signal from the first antenna, positioned on the near side of the traveling direction of vehicle, and rectangles of broken line represent an outgoing signal from the second antenna in the traveling direction of vehicle, wherein the outgoing signals from the first and second antennas are temporally separated.

As shown in FIG. 11, one frame is formed by two types of slots, namely frame control message slot (hereinbelow referred to as FCMS), in which frequency information is written, and message data slot (hereinbelow referred to as MDS), of which frequency information is blank. It is possible to select the frequency by receiving FCMS. The slot has a length of about 0.78 ms. However, as illustrated in FIG. 11, when the head of the first frame is not received, it is necessary to continue the receipt for approximately more than 5.46 ms until the tail of FCMS in the succeeding frame. By adding a frequency fix time of about 1.5 ms in PLL, it is necessary to search the frequency at an interval of more than about 7 ms.

Accordingly, when the conventional technique is applied to ITS using seven frequencies described above, it is necessary to provide a frequency search time utmost about 49 ms. Therefore, there are problems that the search time becomes very long and the ETC standard requiring that the frequency be completely selected within nine frames, i.e. about 21.1 mS, is not satisfied.

SUMMARY OF THE INVENTION

It is an object of the present invention to solve the above-mentioned problems inherent in the conventional technique and to provide an on-vehicle equipment for DSRC in ITS, which certainly fixes as a predetermined frequency with high efficiency.

According to a first aspect of the present invention, there is provided an on-vehicle equipment for Dedicated Short-Range Communication (DSRC) in Intelligent Transport System (ITS) including: a receiving antenna for receiving radio waves sent out of on-road equipments; a frequency converting unit for converting the frequencies to signals of a predetermined frequencies in a plurality of local frequencies; a channel selecting filter unit for taking only a predetermined channel out of the signal obtained in the frequency converting unit; a demodulator for digitizing an output from the channel selecting filter unit; a normal reception determining unit for judging whether or not the radio wave is normally received based on an output from the demodulator; a PLL oscillating unit for outputting the local frequencies to the frequency converting unit; and a frequency switching determining means for outputting a selected frequency signal by sequentially switching the local frequencies at a predetermined cycle in accordance with a preset priority sequence of switching the local frequencies in correspondence with types of the on-road equipments, whereby a desirable communication frequency can be certainly fixed with high efficiency even though the number of frequencies to be selected is large.

According to a second aspect of the present invention, there is provided the on-vehicle equipment for DSRC in ITS, wherein the frequency switching determining means is set so as to highly frequently select a frequency of high priority, whereby a desirable communication frequency can be certainly fixed with high efficiency even though the number of frequencies to be selected is large.

According to a third aspect of the present invention, there is provided the on-vehicle equipment for DSRC in ITS, wherein the frequency switching determining means determines the priority sequence of the frequencies based on the vehicle speed, whereby a desirable communication frequency can be fixed with high efficiency even though the number of frequencies to be selected is large.

According to a fourth aspect of the present invention, there is provided the on-vehicle equipment for DSRC in ITS, wherein the frequency switching determining means is operated under a first control mode of selecting only a frequency or frequencies of high priority and a second control mode of selecting at least a frequency of low priority, and the first control mode is transferred to the second control mode when a switching command is externally inputted, whereby a communication frequency required by the driver can be quickly selected.

According to a fifth aspect of the present invention, there is provided the on-vehicle equipment for DSRC in ITS, wherein the frequency switching determining means returns from the second control mode to the first control mode after a lapse of a predetermined time period from the transfer from the first control mode to the second control mode, whereby the second control mode of selecting the frequencies of low priority is quickly returned to the first control mode of selecting the frequencies of high priority after a lapse of a predetermined time, whereby erroneous selection of the frequencies of high priority can be prevented.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1 is a block chart showing a structure of an on-vehicle equipment for DSRC in ITS according to Embodiment 1 of the present invention;

FIG. 2 is a table showing a priority sequence of selected f1/f7 signals, memorized in a frequency priority sequence memory unit in the on-vehicle equipment for DSRC in ITS according to Embodiment 1 of the present invention;

FIG. 3 is a table showing an example of selecting frequencies in the on-vehicle equipment for DSRC in ITS according to Embodiment 1 of the present invention;

FIG. 4 is a Table for showing another example of selecting the frequencies in the on-vehicle equipment for DSRC in ITS according to Embodiment 1 of the present invention;

DETAILED DESCRIPTION OF THE PREFERRED EMBODIMENTS

Figure 5:
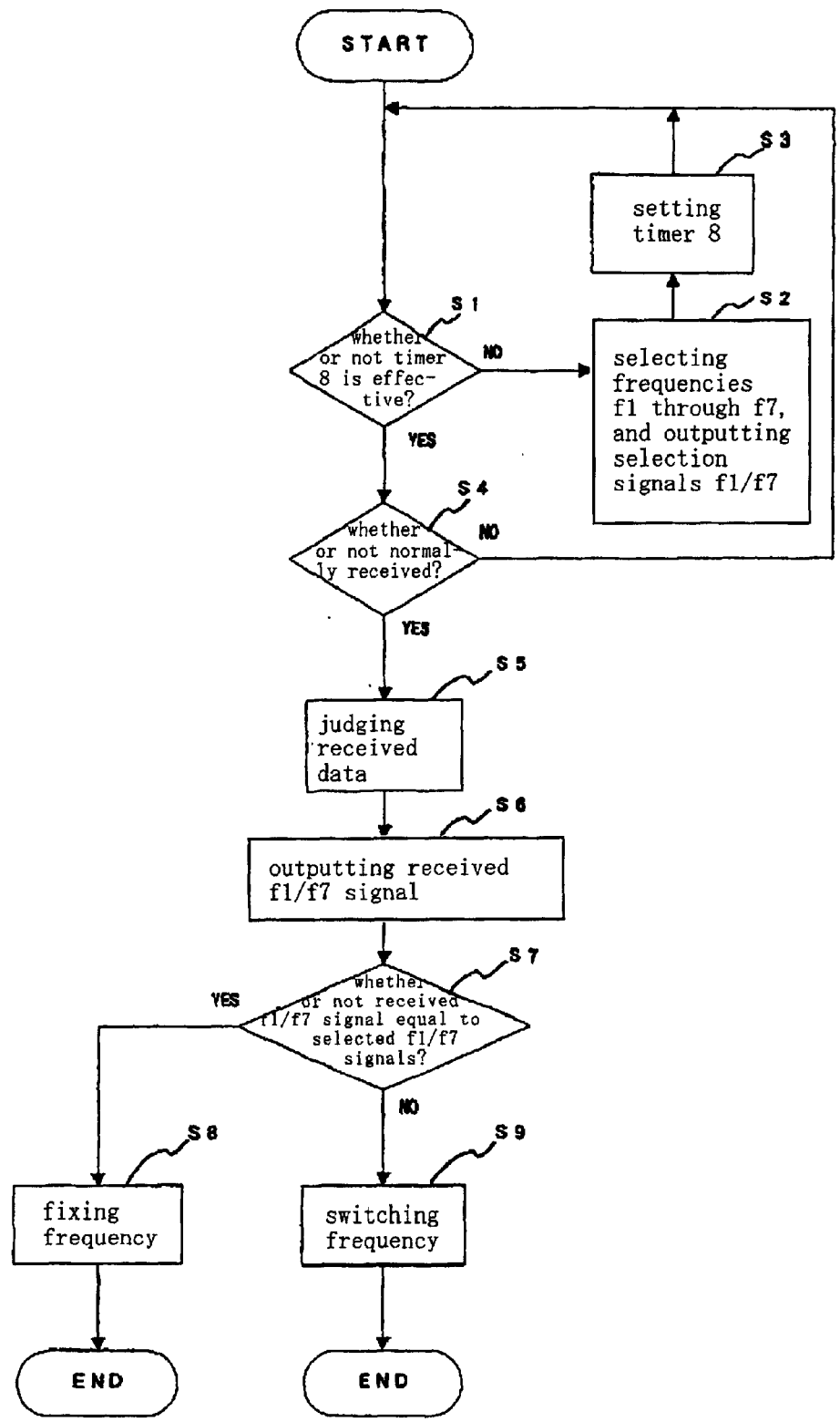
FIG. 5 is a flow chart showing an operation of a frequency switching determining unit of the on-vehicle equipment for DSRC in ITS according to Embodiment 1 of the present invention.

A detailed explanation will be given of preferred embodiments of the present invention in reference to FIGS. 1 through 11 as follows, wherein the same numerical references are used for the same or similar portion and description of these portion is omitted.

Embodiment 1

FIG. 1 is the block chart showing the structure of the on-vehicle equipment for DSRC in ITS according to Embodiment 1 of the present invention. In FIG. 1, numerical reference 1 designates a receiving antenna for receiving radio waves sent out of on-road equipments; numerical reference 2 designates a frequency converting unit for converting a frequency for the radio wave received by the receiving antenna 1 to a predetermined receiving frequency; numerical reference 3 designates a channel selecting filter taking a predetermined channel out of a signal obtained by converting the frequency in the frequency converting unit 2; numerical reference 4 designates a demodulator for digitizing an output from the channel selecting filter 3; numerical reference 5 designates a normal reception determining unit for judging whether or not data embedded in the received frequency are normal in use of error check such as CRC; numerical reference 6 designates a PLL oscillating unit for generating a local frequency and sending it to the frequency converting unit 2; numerical reference 7 designates a frequency switching determining unit for determining a frequency of the received data and judging whether the local frequency outputted from PLL oscillating unit 6 is fixed or switched over based on the received f1/f7 signal obtained as a result of the determined frequency and selected f1/f7 signals representing a currently selected frequency; numerical reference 8 designates a timer for controlling a cycle of the selected frequency signal; and numerical reference 9 designates a frequency priority sequence memory unit for memorizing frequencies, for example as much as seven, and a priority sequence of selecting the frequencies.

FIG. 2 is the table for showing a priority sequence for selecting the selected f1/f7 signals, memorized in the frequency priority sequence memory unit of the on-vehicle equipment for DSRC in ITS according to Embodiment 1. For example, as illustrated in FIG. 2, Frequencies f1 and f2 used for ETC, requiring operation under severe conditions that the frequency select time is extremely short because radio waves are received during high-speed run and erroneous detection, resulting in a charge to a driver, is not permitted are in the highest priority sequence of 1.

Further, Frequencies f3 and f4 used in Advanced Cruise-Assistant Highway System-Information (hereinbelow referred to as AHS-i) for providing information shower such as traffic information, guide of curve, and information of road condition, in which certainty is not required in comparison with ETC though the information and the guide are received during high-speed run.

Further, in logistic control for controlling destinations of vehicles, senders, specifications of packs, and so on by communicating with entering and dispatching vehicles through an on-road equipment located at around a garage of freight company, radio waves are received under a situation that a speed of vehicle is relatively low for entering and dispatching. Frequencies f5 and f6 used therefore are in a priority sequence of 3.

Further, Frequency f7 used to receive payment in drive-through shops, gas stations, and so on where problems are not caused even though the frequency select time is relatively long is in the lowest priority sequence of 4 because radio waves are received in a state that a vehicle substantially stops.

FIG. 3 is the table showing an example of selecting the frequencies based on the selection priority sequence of the selected f1/f7 signals, memorized in the frequency priority sequence memory unit of the on-vehicle equipment for DSR in ITS according to Embodiment 1 of the present invention. As illustrated, Frequencies f1 and f2 of which priority sequence is the highest are set to be in the first priority, Frequencies f3 and f4 of which priority sequence is in 2 are set to be in the second priority, Frequencies f5 and f6 of which priority sequence is in 3 are set to be in the third priority, and Frequency f7 of which priority sequence is lowest is set to be in the fourth priority. Groups of Step 1 through Step 15 are set so that one group includes a plurality of frequencies selected out of the frequencies in the first through fourth priorities. Accordingly, the order of selecting the frequencies is from the first priority to the fourth priority and from Step 1 to Step 15.

Because in all of Step 1 through Step 15, Frequencies f1 and f2 are set in the first priority, chances that the frequencies of the highest priority are selected increase. Further, because the second priority through the fourth priority are selected in a part of the steps, chances that the second through fourth priorities are selected are lower than that in the first priority, and the chances that the second priority, the third priority, and the fourth priority are selected decrease in this order.

FIG. 4 is the table showing another example of selecting the frequencies. Although, in selecting the frequencies as shown in FIG. 3, three types of frequency are used in one step, four types of frequency are used in one step, for example as illustrated in Step 12 of FIG. 4 such that the priority sequences of Frequencies f6 and f7 are the same.

Next, an operation will be described. FIG. 5 is the flow chart showing an operation of the frequency switching determining unit for DSRC in ITS according to Embodiment 1 of the present invention. In Step S1 of FIG. 5, it is judged whether or not the timer for controlling an output cycle of the selected f1/f7 signals is effective. If it is judged not to be effective, the frequencies f1 through f7 are selected in use of the method illustrated in FIG. 3 or 4, and the selected frequency is outputted as the selected f1/f7 signals in Step S2. In Step S3, the timer 8 is set.

When the timer 8 is judged to be effective in Step S1, it is judged whether or not the radio wave sent out of the on-road equipment is normally received in Step S4. If the radio wave is normally received, the received frequency is judged among the frequencies f1 through f7 in Step S5. In Step S6, the received f1/f7 signals are outputted. In Step S7, the received f1/f7 signals are compared with the selected f1/f7 signals selected in Step S2. If the received signal is the same as the selection signal, the local frequency outputted from the PLL oscillating unit 6 is fixed in Step S8. If the received signal is different from the selected signal, the frequency outputted from the PLL oscillating unit 6 is switched in Step S9.

As described, according to Embodiment 1, because the frequencies of high priority are frequently selected even though the number of frequencies to be selected is large, it is possible to certainly fix a desirable communication frequency with high efficiency in comparison with the conventional technique of evenly selecting all of the frequencies. Further, when the priority sequence of the frequency used for ETC is set to be the highest, this frequency is very often selected, and it is possible to satisfy the above-described standard of ETC by completing to select the frequency within nine frames.

This embodiment of using DSRC illustrating in FIG. 2 according to Embodiment 1 is only one example, and an application of the present invention is not limited thereto. Further, the frequency selection illustrated in FIGS. 3 and 4 is only one example, and the selection is not limited thereto.

Embodiment 2

Figure 6:
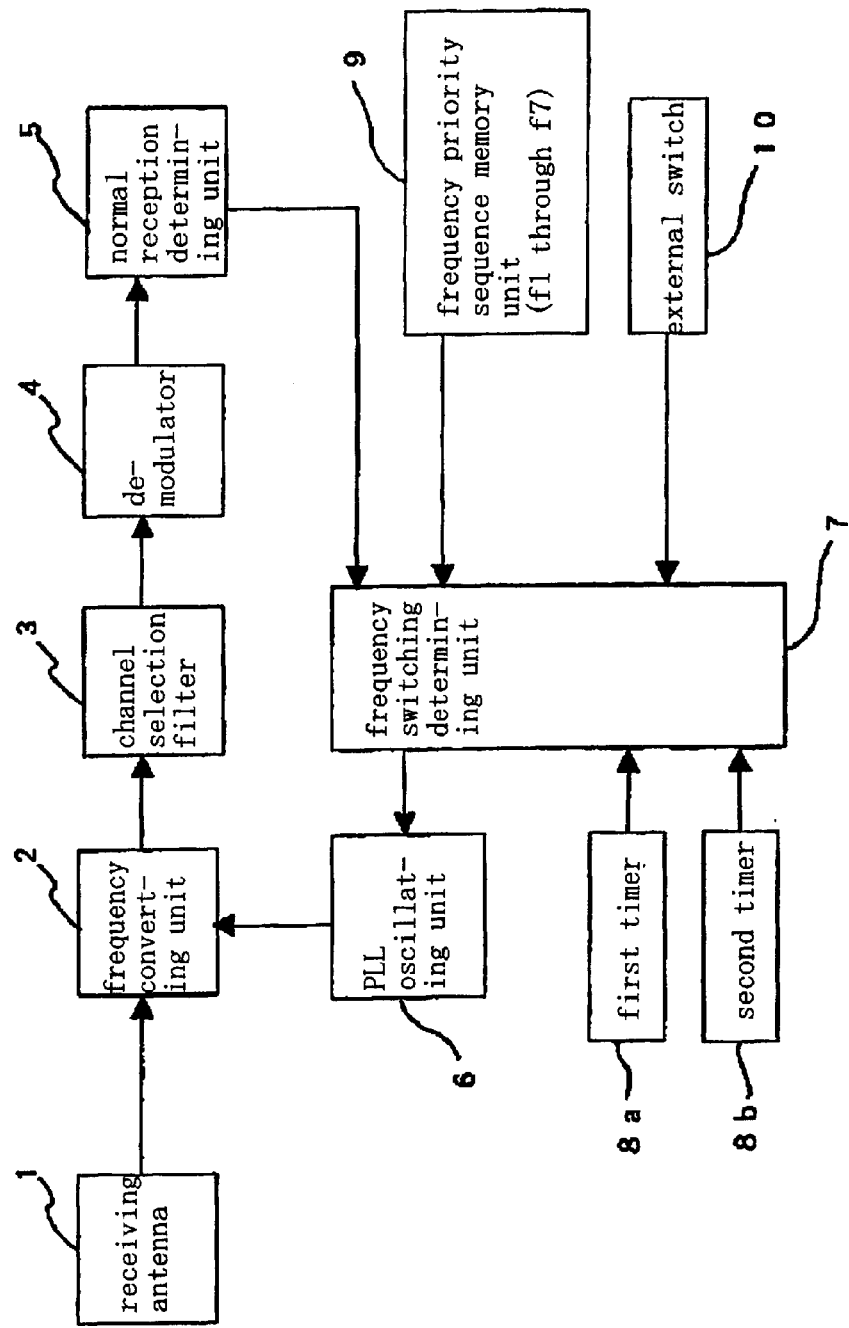
FIG. 6 is a block chart showing a structure of an on-vehicle equipment for DSRC in ITS according to Embodiment 2 of the present invention.

FIG. 6 is the block chart showing the structure of the on-vehicle equipment for DSRC in ITS according to Embodiment 2 of the present invention. In FIG. 6, numerical reference 8a designates a first timer for controlling an output cycle of a frequency of high priority; numerical reference 8b designates a second timer for controlling an output cycle of a frequency of low priority; and numerical reference 10 designates an external switch. Description of portions similar to or the same as those in FIG. 1 according to Embodiment 1 is omitted.

Figure 7:
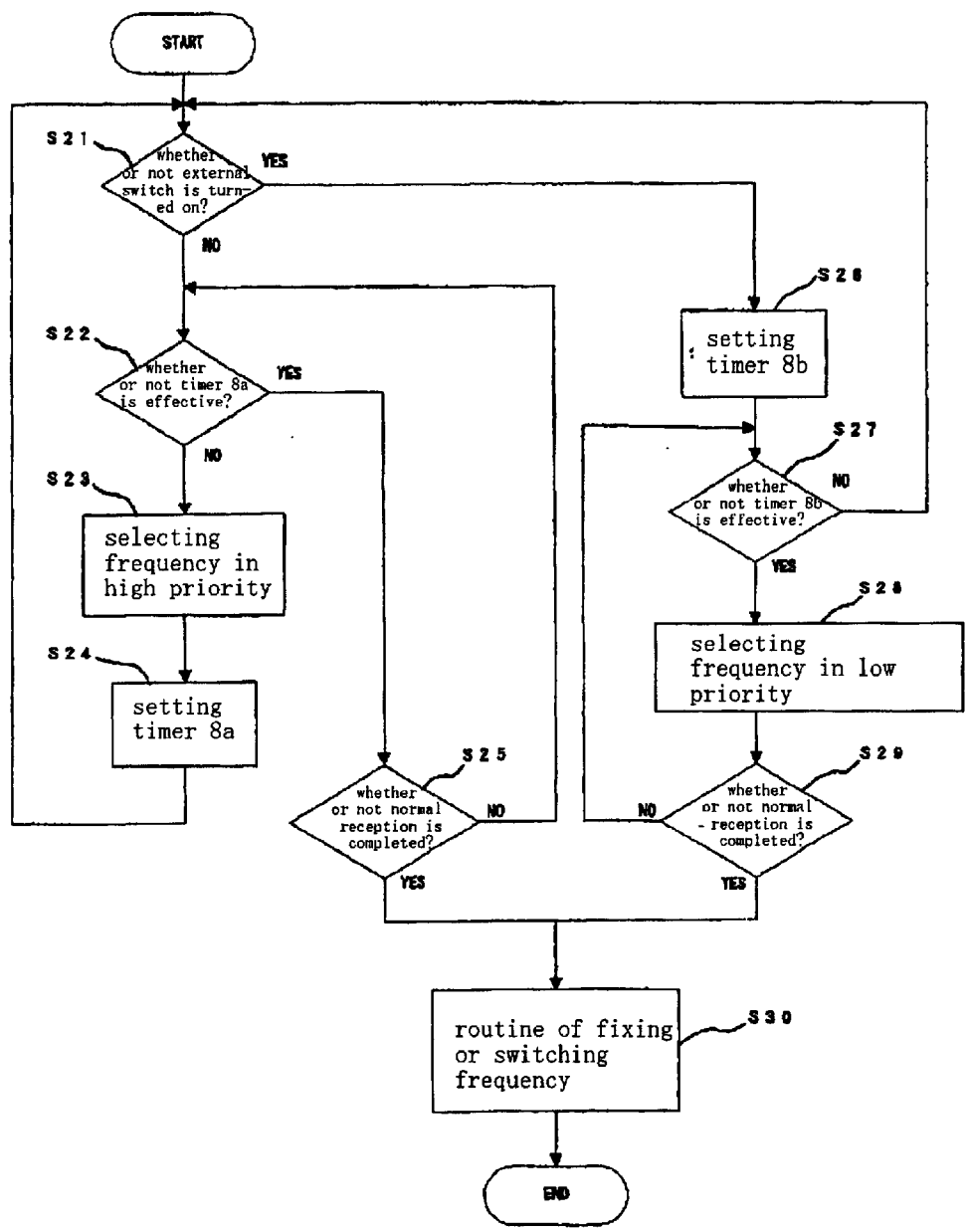
FIG. 7 is a flow chart showing an operation of a frequency switching determining unit in the on-vehicle equipment for DSRC in ITS according to Embodiment 2 of the present invention.

FIG. 7 is the flow chart showing the operation of the frequency switching determining unit of the on-vehicle equipment for DSRC in ITS. The frequency switching determining unit according to Embodiment 2 is operable under a first control mode for selecting only frequencies of high priority and a second control mode for selecting at least a frequency of low priority, wherein the first control mode is transferred to the second control mode when a switch-over command is externally inputted.

In FIG. 7, it is judged whether or not the external switch 10 is turned on in Step S21. If the external switch 10 is not turned on, the frequency switching determining unit is operated under the first control mode including Steps S22 through S25. If the external switch 10 is turned on, the frequency switching determining unit is operated under the second control mode including Steps S26 through S29.

In Step S22, if the external switch 10 is not turned on in Step S21, it is judged whether or not the first timer 8a is effective. If it is effective, it is judged whether or not a radio wave sent out of an on-road equipment is normally received in Step S25. If the radio wave is normally received in Step S30, a routine of fixing or switching frequency in Steps S5 through S9 in FIG. 5, which has been described in detail in Embodiment 1, is performed.

On the other hand, if the first timer 8a is judged not to be effective in Step S22, frequencies of high priority, for example frequencies f1 and f2, are selected and the selected frequency is outputted as a selected f1/f7 signals in Step S23. In Step S24, the timer 8a is set.

Further, in Step S26, if the external switch 10 is turned on in Step S21, the second timer 8b is set. In Step S27, it is judged whether or not the second timer 8b is effective. If the second timer is judged to be effective, a frequency of low priority, e.g. frequencies other than the frequencies f1 and f2 is selected, and the selected frequency is outputted as the selected f1/f7 signals in Step S28. In Step S29, it is judged whether or not the radio wave sent out of the on-road equipment is normally received. If it is normally received, in Step S30, a routine of fixing or switching frequency in Steps S5 through S9 is performed as in FIG. 5, which routine has been described in detail in Embodiment 1.

As described, according to Embodiment 2, when it is previously known that a vehicle reaches a location of an on-road equipment sending out a frequency of low priority, e.g. drive-through shop and gas station, the control modes are changed over by the external switch 10, whereby an effect of quickly selecting a frequency required by a driver is obtainable.

Although, in Embodiment 2, f1 and f2 are provisionally exemplified as the frequency of high priority, and the frequencies other than f1 and f2 are provisionally exemplified as the frequency of low priority, it is possible to arbitrarily set the frequencies of high priority to be f1 through f4 and the frequencies of low priority to be f5 through f7, whereby it is needless to say that a similar effect is obtainable.

Embodiment 3

Figures 8, 9:
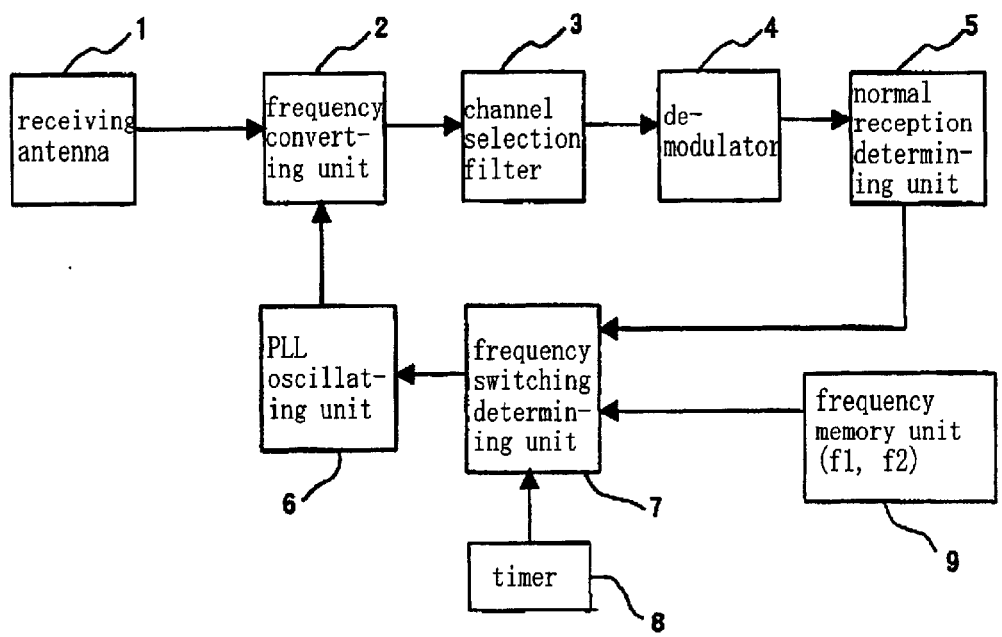
FIG. 8 is a table showing an example of selecting a frequencies in an on-vehicle equipment for DSRC in ITS according to Embodiment 3 of the present invention.
FIG. 9 is a block chart showing a structure of a conventional on-vehicle equipment for DSRC in ITS.
Figure 10:
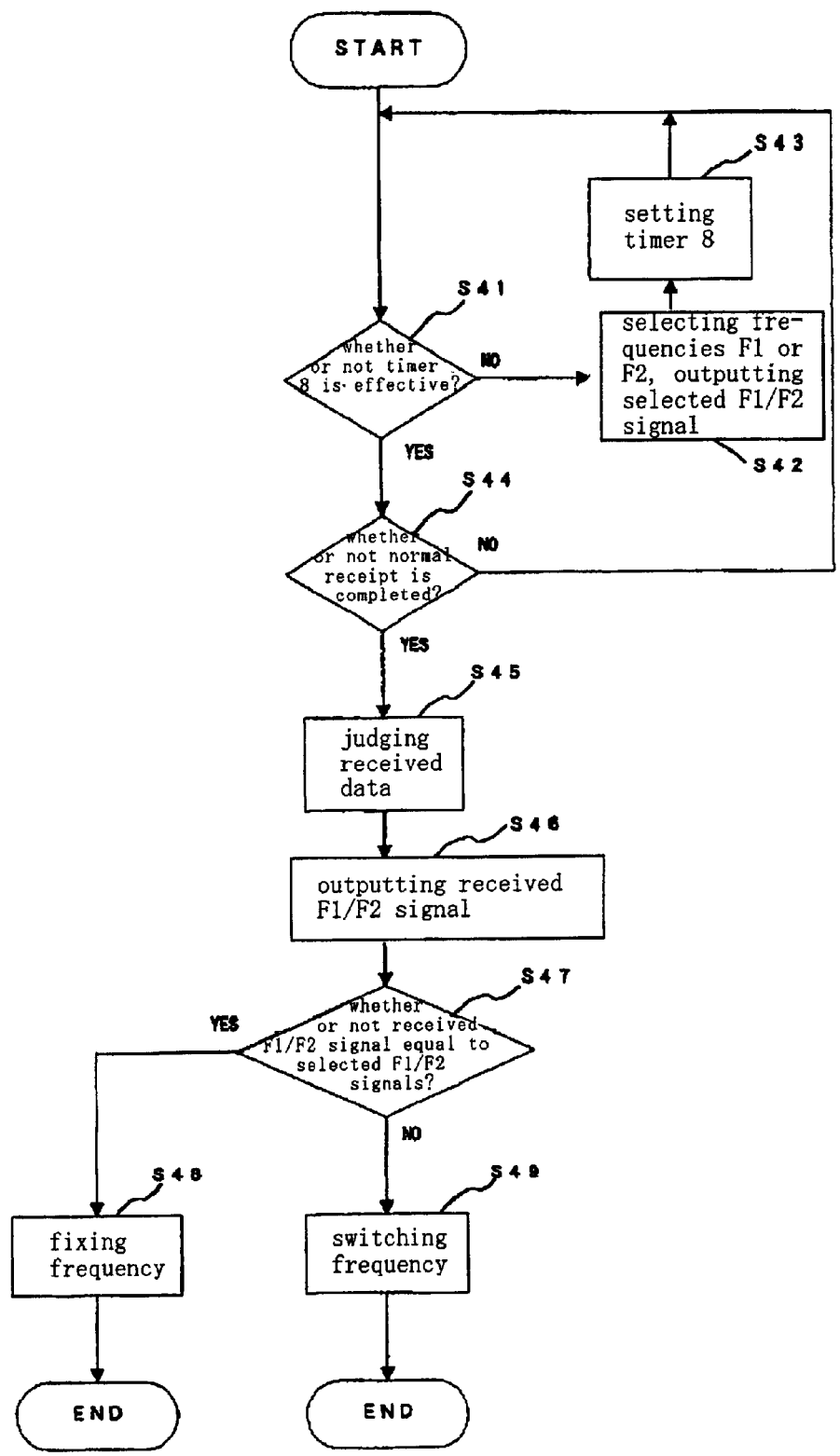
FIG. 10 is a flow chart showing an operation of a frequency switching determining unit in the conventional on-vehicle equipment for DSRC in ITS.
Figure 11:
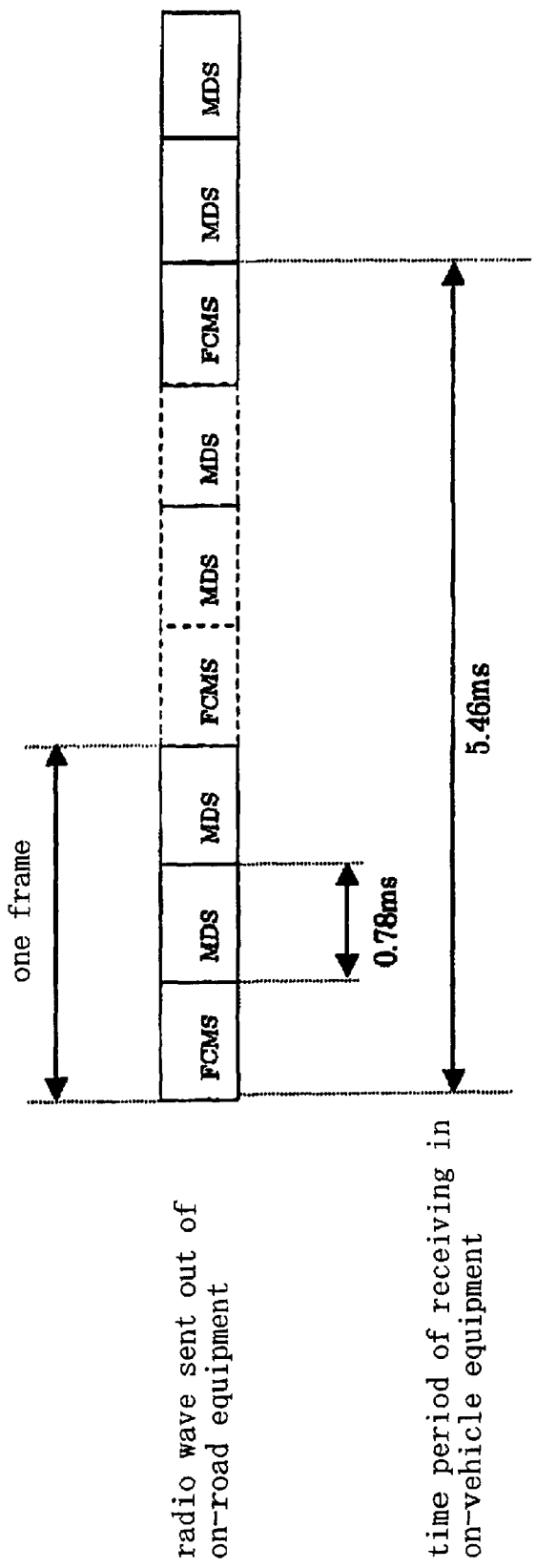
FIG. 11 explains problems in the conventional on-vehicle equipment for DSRC.

FIG. 8 is the table showing an example of selecting frequency by the on-vehicle equipment for DSRC in ITS according to Embodiment 3 of the present invention. The above-described relationship between usage of DSRC, for example, ETC and drive-through shop, and the priority sequence of frequency depends on the vehicle speed. A frequency switching determining means according to Embodiment 3 determines a selection of local frequencies based on the vehicle speed.

As illustrated in FIG. 8, when a vehicle runs at a speed of 60 km/h or more, there is high probability of using ETC and very low probability of stopover in a gas station, a drive-through shop, or the like. Therefore, only the first priority, i.e. Frequencies f1 and f2 in FIG. 3, is selected. The frequencies of low priority are selected as the vehicle speed decreases.

Although, in the above-described embodiments, the frequencies are from f1 through f7 as much as seven, the present invention may be applicable to a case of using a plurality of frequencies other than seven, and a similar effect is obtainable.

Obviously, numerous modifications and variations of the present invention are possible in light of the above teachings. It is therefore to be understood that within the scope of the appended claims, the invention may be practiced otherwise than as specifically described herein.

The entire disclosure of Japanese Patent Application No. 2002-002519 filed on Jan. 9, 2002 including specification, claims, drawings and summary are incorporated herein by reference in its entirety.

What is claimed is:

1. An on-vehicle equipment for Dedicated Short-Range Communication (DSRC) in an Intelligent Transport System (ITS) comprising:
   a receiving antenna for receiving a radio wave signal transmitted from on-road equipment;
   a frequency converting unit for converting a receiving frequency for the radio wave signal to a predetermined local frequency among a plurality of local frequencies;
   a channel selecting filter unit for filtering a signal received at the predetermined local frequency to obtain only a signal in a predetermined channel;
   a demodulator for digitizing the predetermined channel signal obtained by the channel selecting filter unit;
   a normal reception determining unit for judging whether the radio wave signal is normally received based on an output from the demodulator;
   a phase locked loop (PLL) oscillating unit for outputting the predetermined local frequency to the frequency converting unit according to a selected frequency signal; and
   a frequency switching determining means for selecting the predetermined local frequency, generating the selected frequency signal by sequentially switching the local frequencies at a predetermined cycle in accordance with a preset priority sequence for switching the local frequencies corresponding to different types of on-road equipments, comparing a receiving frequency signal generated based on the frequency of the received radio wave signal with the selected frequency signal, and setting the local frequency output from the PLL oscillating unit if the receiving frequency signal and the selected frequency signal are equal.

2. The on-vehicle equipment for DSRC in the ITS according to claim 1, wherein the frequency switching determining means is configured to switch to a local frequency of high priority more often than a local frequency of low priority.

3. The on-vehicle equipment for DSRC in the ITS according to claim 1, wherein the frequency switching determining means determines the priority sequence for switching the local frequencies based on the vehicle speed.

4. The on-vehicle equipment for DSRC in the ITS according to claim 1, wherein the frequency switching determining means is configured to operate under a first control mode of selecting only a local frequency or frequencies of high priority and a second control mode of selecting at least a local frequency of low priority, and a control mode of the frequency switching determining means is changed from the first control mode to the second control mode when a switching command is externally inputted.

5. The on-vehicle equipment for DSRC in the ITS according to claim 4, wherein the control mode of the frequency switching determining means is changed from the second control mode to the first control mode after a lapse of a predetermined time period from a change from the first control mode to the second control mode.

* * * * *